(12) United States Patent
Om et al.

(10) Patent No.: US 8,268,685 B2
(45) Date of Patent: Sep. 18, 2012

(54) NAND FLASH MEMORY DEVICE AND METHOD OF MANUFACTURING THE SAME

(75) Inventors: Jae Chul Om, Icheon-si (KR); Nam Kyeong Kim, Icheon-si (KR); Se Jun Kim, Changwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/069,273

(22) Filed: Mar. 22, 2011

(65) Prior Publication Data

US 2011/0171797 A1 Jul. 14, 2011

Related U.S. Application Data

(62) Division of application No. 12/041,949, filed on Mar. 4, 2008, now Pat. No. 7,910,430, which is a division of application No. 11/445,770, filed on Jun. 2, 2006, now Pat. No. 7,456,466.

(30) Foreign Application Priority Data

Jul. 4, 2005 (KR) .............................. 10-2005-59869

(51) Int. Cl.
*H01L 21/336* (2006.01)

(52) U.S. Cl. ........ 438/257; 438/201; 438/259; 438/593; 257/E21.422

(58) Field of Classification Search .................. 438/201, 438/211, 257–259, 593; 257/E21.179, E21.422
See application file for complete search history.

(56) References Cited

U.S. PATENT DOCUMENTS

| | | | |
|---|---|---|---|
| 6,888,190 B2 | 5/2005 | Yang et al. | |
| 7,180,121 B2 | 2/2007 | Hieda | |
| 2001/0039091 A1 | 11/2001 | Nakagawa | |
| 2002/0149050 A1 | 10/2002 | Fazio et al. | |
| 2004/0079988 A1 | 4/2004 | Harari | |
| 2005/0090052 A1 | 4/2005 | Matsui et al. | |
| 2006/0023558 A1 | 2/2006 | Cho et al. | |
| 2006/0027855 A1 | 2/2006 | Hur et al. | |
| 2006/0289926 A1* | 12/2006 | Matsuno | 257/316 |

FOREIGN PATENT DOCUMENTS

| | | |
|---|---|---|
| CN | 1416592 | 5/2003 |
| CN | 1495905 | 5/2004 |
| JP | 62-245676 A | 10/1987 |
| JP | 04-079370 A | 3/1992 |
| JP | 2002-176114 A | 6/2002 |
| JP | 2002-358792 A | 12/2002 |

OTHER PUBLICATIONS

State Intellectual Property Office, The First Office Action, Application No. 2006100941797, Mar. 28, 2008.

* cited by examiner

*Primary Examiner* — Thanhha Pham
(74) *Attorney, Agent, or Firm* — Kilpatrick Townsend & Stockton LLP

(57) ABSTRACT

A NAND flash memory device and method of manufacturing the same is disclosed. Source and drain select transistor gates are recessed lower than an active region of a semiconductor substrate. A valid channel length of the source and drain select transistor gates is longer than a channel length of memory cell gates. Accordingly, an electric field between a source region and a drain region of the select transistor can be reduced. It is thus possible to prevent program disturbance from occurring in edge memory cells adjacent to the source and drain select transistors in non-selected cell strings.

6 Claims, 11 Drawing Sheets

NAND FLASH MEMORY DEVICE AND METHOD OF MANUFACTURING THE SAME

CROSS-REFERENCE TO RELATED APPLICATIONS

The present invention is a divisional of U.S. patent application Ser. No. 12/041,949, filed on Mar. 4, 2008, now U.S. pat. No. 7,910,430, which is a divisional of U.S. patent application Ser. No. 11/445,770, filed Jun. 2, 2006, now U.S. Pat. No. 7,456,466, which claims priority of Korean patent application number 10-2005-59869, filed on Jul. 4, 2005, all of which are incorporated by reference in their entirety.

BACKGROUND

The present invention relates to a NAND flash memory device and method of manufacturing the same. More particularly, the present invention relates to preventing program disturbance memory cells adjacent to drain select transistors and source select transistors in a NAND flash memory device.

A flash memory is a type of a non-volatile memory in which data can be stored even when power is turned off. The flash memory can be electrically programmed and erased and does not need a refresh function of rewriting data at regular intervals. The term "program" refers to the operation of programming data into the memory cells and the term "erase" refers to the operation of erasing data from the memory cells.

The flash memory device can be mainly classified into a NOR flash memory device and a NAND flash memory device depending on the structure of the cell and operation conditions. In the NOR flash memory device, the source of each memory cell transistor is connected to the ground terminal (VSS) to enable program and erase functions for a predetermined address. Accordingly, the NOR flash memory has been mainly used for application fields requiring the high-speed operation.

On the other hand, in the NAND flash memory, a plurality of memory cells are connected in series to form one string. One string is connected to the source and drain. The NAND flash memory has been mainly used for high integration data retention related fields.

FIG. 1 is a circuit wiring diagram of a conventional NAND flash memory device.

Referring to FIG. 1, there are 32 memory cells MC0 to MC31 connected in series between a drain select transistor DST and a source select transistor SST. It should be appreciated that 16 or 64 memory cells could be connected in series, taking device and density into consideration.

In FIG. 1, 32 memory cells form one string and N strings 1-1 to 1-n are disposed. A memory cell (for example, MC0) is controlled by one word line WL0 and forms one page, i.e., the group of memory cells. In FIG. 1, 32 pages are shown.

In the program operation of the NAND flash memory device constructed as shown in FIG. 1, in a non-selected string (for example, 1-1), when a memory cell to be programmed is MC2, the channel voltage of the memory cells MC0, MC1, and MC3-MC31 which will not be programmed is boosted to approximately 8V in order to prevent program disturbance. If the channel voltage rises to about 8V as described above, program disturbance is generated in the memory cells MC0 and MC31 adjacent to the source select transistor SST and the drain select transistor DST.

During the program operation, the gate of an adjacent source select transistor SST is applied with a voltage of 0V, the gate of the drain select transistor DST is applied with a voltage of VCC, and the gates of the memory cells MC0, MC1, and MC3-MC31, which will not be programmed, are applied with a program-prohibit voltage (Vpass) voltage of approximately 10V. Accordingly, the channel voltage of the source select transistor SST is boosted to approximately 0V, the channel voltage of the drain select transistor DST is boosted to approximately 1V and the channel voltage of the memory cells MC0, MC1, MC3-MC31 is boosted to approximately 8V.

In this case, a strong traverse electric field is formed between the source select transistor SST and the memory cell MC0 due to a voltage difference between the channel voltage of 0V of the source select transistor SST and the channel voltage of 8V of the memory cell MC0. A strong traverse electric field is also formed between the drain select transistor DST and the memory cell MC31 due to a voltage difference between the channel voltage of 1V of the drain select transistor DST and the channel voltage of 8V of the memory cell MC31.

If a strong electric field is generated in a traverse direction as described above, electrons, which are generated at the interface between the gate oxide film of the source select transistor SST and the silicon substrate, become hot electrons while moving toward the memory cell MC0 along the surface of the silicon substrate. The hot electrons generated as described above move in a longitudinal direction and are then introduced into the floating gate of the memory cell MC0 that should not be programmed, thereby programming data into the memory cell MC0 within a non-selected string 1-1. The drain select transistor DST has a gate voltage, which is relatively higher than that of the source select transistor SST. Accordingly, the number of electrons in the drain select transistor DST is relatively smaller than that in the source select transistor SST. As a result, program disturbance is lower in memory cell MC31 than in memory cell MC0.

FIG. 2 is a graph illustrating the relationship between a threshold voltage (Vt) and a program-prohibit voltage (Vpass) of the memory cells MC0, MC31 (i.e., memory cells in which program disturbance has occurred because of hot electrons).

From FIG. 2, it can be seen that the memory cells MC0, M31 connected to the first and last word lines WL0, WL31 have different characteristics from those of the memory cells MC1 to MC30 connected to the remaining word lines WL1 to WL30. This is because program disturbance has occurred due to hot electrons as described above.

The program disturbance phenomenon shown in FIG. 2 becomes severe as the size of the memory cell becomes small and also becomes severe in multi-level cells. The program disturbance phenomenon is undesirable in that it degrades the performance of devices.

SUMMARY OF THE INVENTION

An embodiment of the present invention relates to the prevention of program disturbance occurring in memory cells adjacent to drain select transistors and memory cells adjacent to source select transistors in non-selected cell strings during a program operation.

A NAND flash memory device according to one embodiment of the present invention includes drain and source select transistor gates that are recessed lower than an active region of a semiconductor substrate, and memory cell gates formed on the active region between the source select transistor gates and the drain select transistor gates. A channel length in a longitudinal direction of the recessed source and drain select transistor gates may be longer than that of the memory cell gates.

A NAND flash memory device according to another embodiment of the present invention includes source select transistor gates that are recessed lower than an active region of a semiconductor substrate, drain select transistor gates formed on the active region of the semiconductor substrate, and memory cell gates formed on the active region between the source select transistor gates and the drain select transistor gates. A channel length in a longitudinal direction of the recessed source select transistor gates may be longer than that of the memory cell gates.

A NAND flash memory device according to still another embodiment of the present invention includes drain select transistor gates that are recessed lower than an active region of a semiconductor substrate, source select transistor gates formed on the active region of the semiconductor substrate, and memory cell gates formed on the active region between the drain select transistor gates and the source select transistor gates. A channel length in a longitudinal direction of the recessed drain select transistor gates may be longer than that of the memory cell gates.

A method of manufacturing a NAND flash memory device according to one embodiment of the present invention includes: forming isolation films on a semiconductor substrate to define active regions; recessing the active regions between the isolation films; forming a tunnel oxide film and a conductive film for a floating gate in the recessed active regions; and forming a dielectric film and a conductive film for a control gate on the entire resulting surface.

A method of manufacturing a NAND flash memory device according to another embodiment of the present invention includes: recessing a gate formation region of a semiconductor substrate; depositing a tunnel oxide film and a polysilicon film for a floating gate and a hard mask on the entire surface of the semiconductor substrate including the recessed region; patterning the hard mask and etching the polysilicon film for the floating gate and the tunnel oxide film using the patterned hard mask as an etch mask; forming trenches for forming isolation films; gap-filling the insides of the trenches with an oxide film and polishing the entire surface to form the isolation films; and forming a dielectric film and a conductive film for the control gate on the polished surface.

BRIEF DESCRIPTION OF THE DRAWINGS

A more compete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF INVENTION

Figure 1:
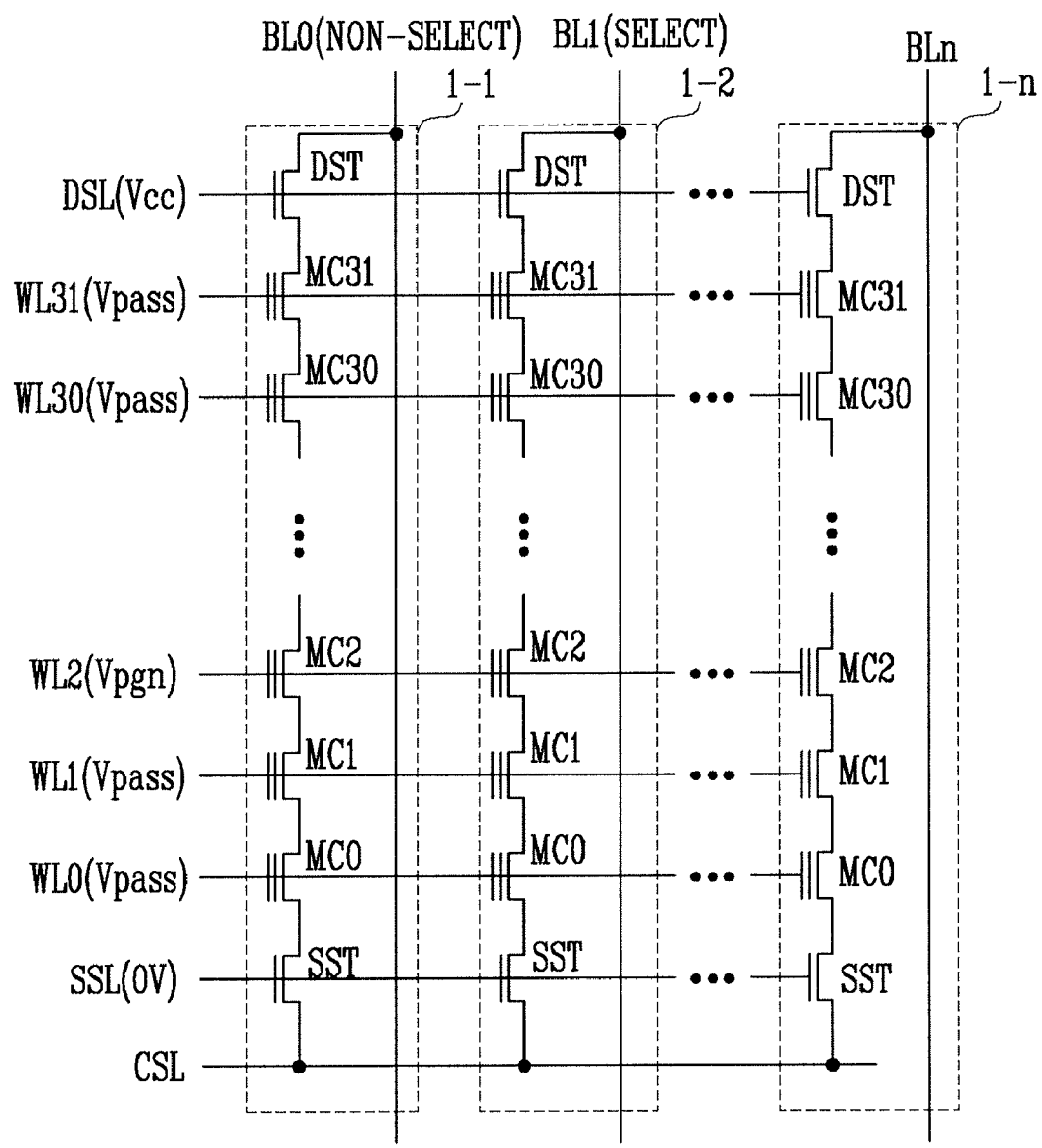
FIG. 1 is a circuit wiring diagram of a conventional NAND flash memory device.
Figure 2:
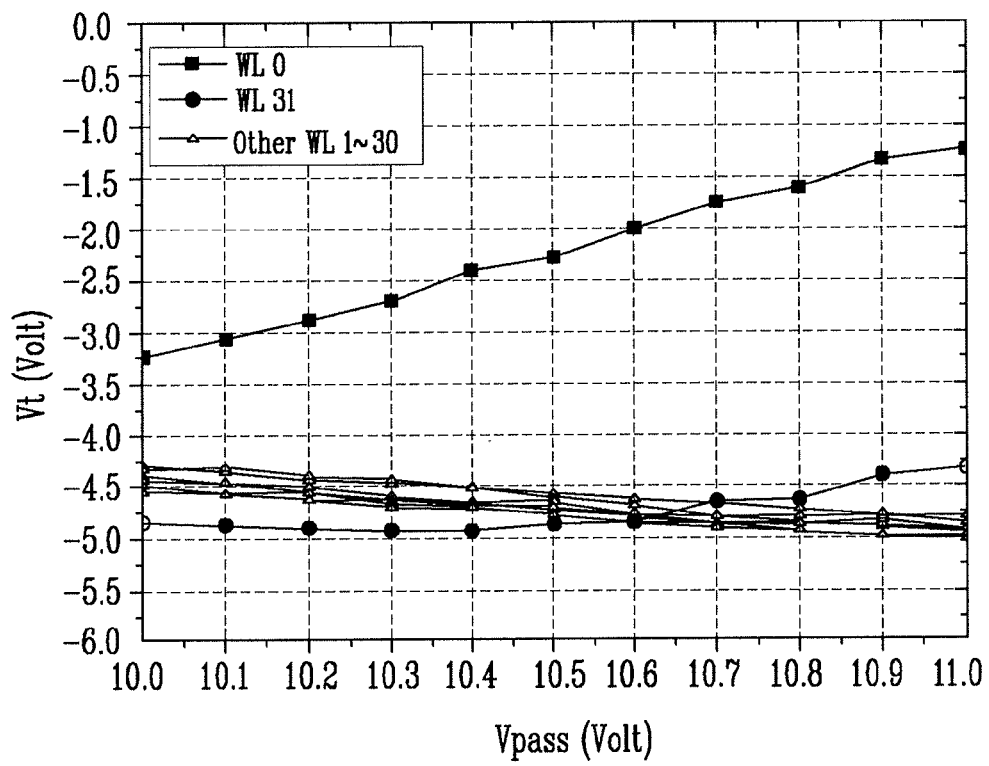
FIG. 2 is a graph showing a phenomenon in which program disturbance is generated every word line of the conventional NAND flash memory device shown in FIG. 1.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

In one embodiment of the present invention, an example is shown in which a select transistor is formed using general Shallow Trenches Isolation (STI). In another embodiment of the present invention, an example is shown in which a select transistor is formed using self-aligned STI.

FIGS. 3A to 3G are cross-sectional views of a NAND flash memory device according to one embodiment of the present invention. FIGS. 4A to 4E are layout diagrams of the NAND flash memory device according to one embodiment of the present invention.

Figure 3A:
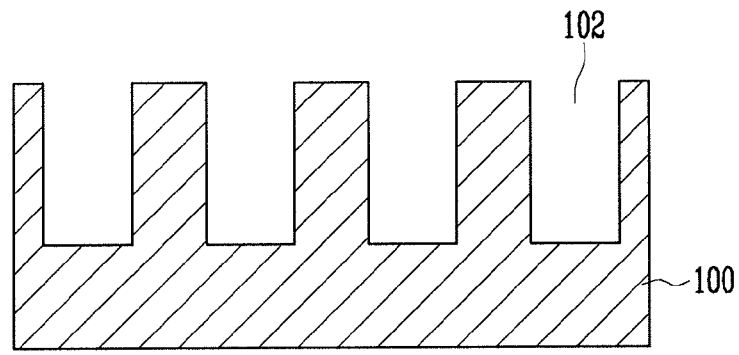
FIGS. 3A to 3G are cross-sectional views of a NAND flash memory device in accordance with one embodiment of the present invention.
Figure 4A:
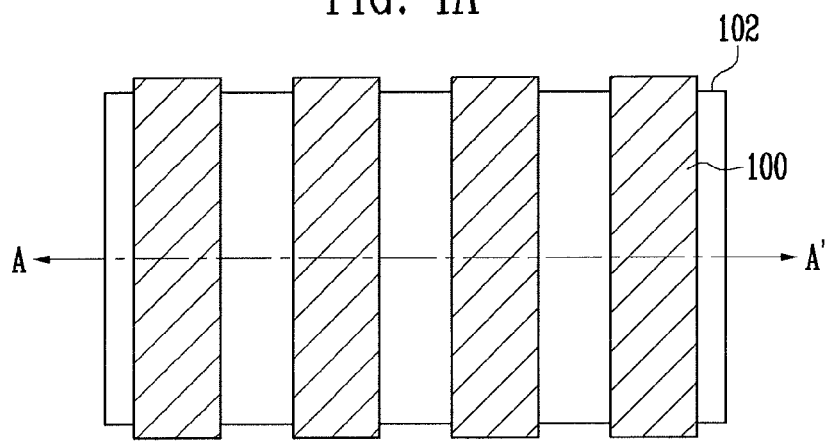
FIGS. 4A to 4E are layout diagrams of the NAND flash memory device in accordance with one embodiment of the present invention.

Referring to FIGS. 3A and 4A, a silicon substrate 100 is selectively etched to form trenches 102 for forming isolation films defining an active region. The isolation films are formed using a STI film, but it should be appreciated that the isolation forms may be formed using other methods such as Local Oxidation of Silicon (LOCOS). FIG. 3A is a cross-sectional view of the NAND flash memory device taken along line A-A' in FIG. 4A.

Figure 3B:
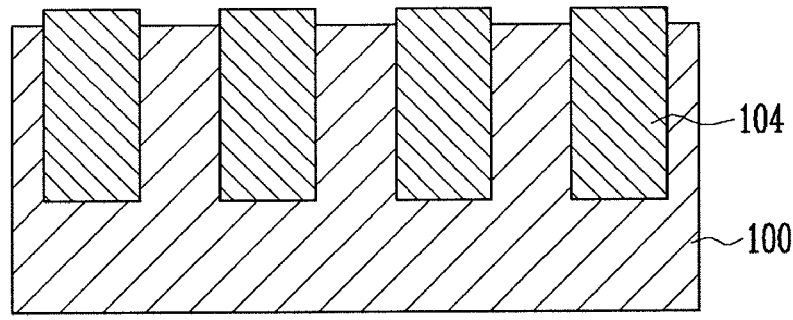
Figure 4B:
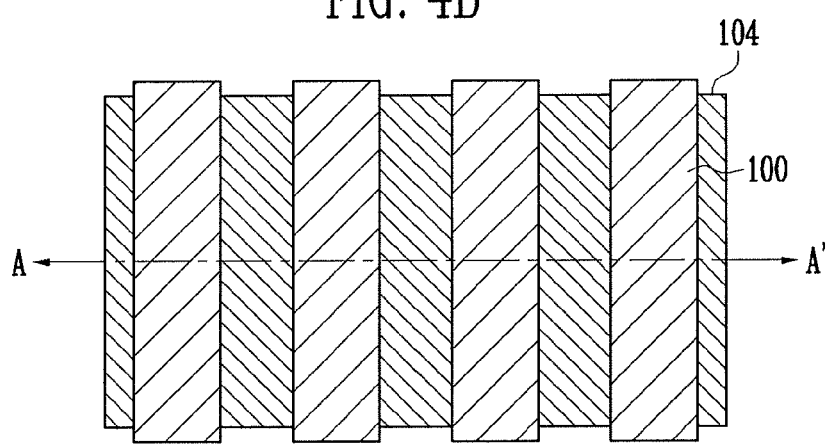

Referring to FIGS. 3B and 4B, the trenches are gap-filled to a thickness of about 300 Å to about 10000 Å using one of a High Density Plasma (HDP) oxide film, Boron-Phosphor Silicate Glass (BPSG) and Silicon On Glass (SOG), or a combination thereof, forming isolation films 104. The entire surface is then polished by Chemical Mechanical Polishing (CMP), blanket etching or the like. FIG. 3B is a cross-sectional view of the NAND flash memory device taken along line A-A' in FIG. 4B.

Figure 3C:
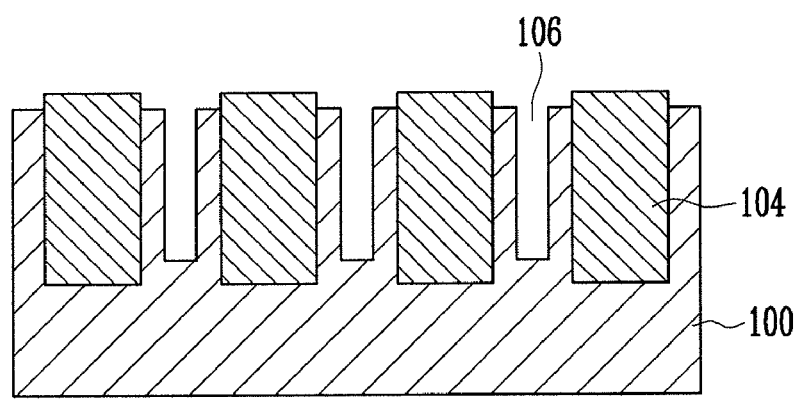
Figure 4C:
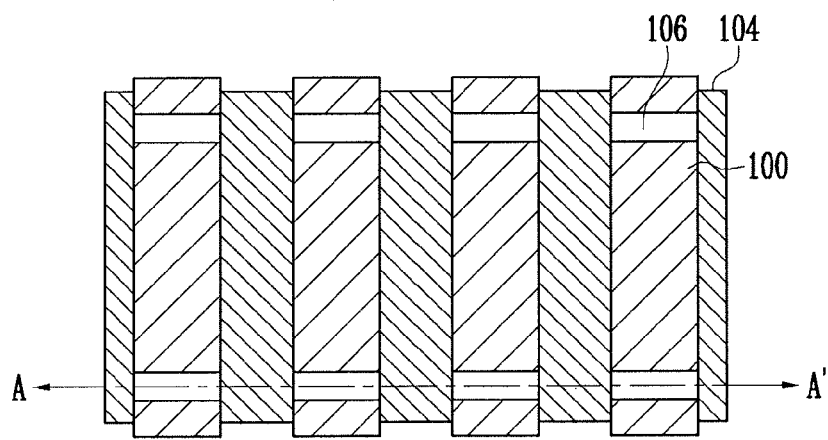
Figure 4D:
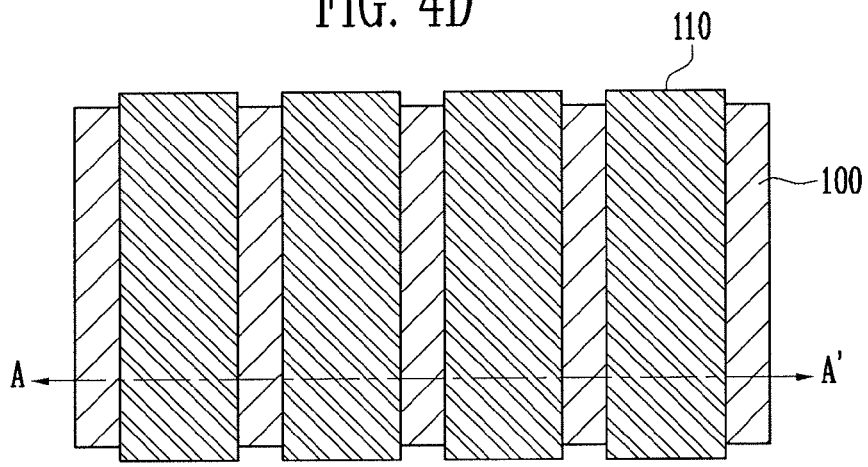

Referring to FIGS. 3C and 4C, to form the gate of a select transistor that is recessed lower than the active region, the active regions of the silicon substrate 100 between the isolation films 104 are recessed to form recess regions 106. The active regions are recessed to form the recess regions 106 in order to prevent program disturbance from occurring in memory cells adjacent to select transistors. This will be described in more detail below. FIG. 3C is a cross-sectional view of the NAND flash memory device taken along line A-A' in FIG. 4C.

To form the recess regions 106, a dry etch method is employed. A gas such as HBr, Ar, or He, which is added to a $Cl_2$ base, may be used as an etch gas. In one embodiment, plasma gas is used as an etch gas and a plasma energy of about 100 Watt to about 3 kWatt is used. At this time, a depth of the recess regions (or trenches) 106 may be set to be less than or the same as that of the isolation films 104. A width (a traverse direction) of the recess regions 106 may be set to be smaller than or the same as that of the memory cell gate.

If the source region and the drain region are formed on the recess regions 106, a valid channel length (a longitudinal direction along the same plane as that of line A-A') of the source region and the drain region is longer than that in the device shown in FIG. 1. Accordingly, the gate length of the source select transistor and the drain select transistor is reduced. In addition, the whole size of the cell string can be shortened.

In addition, an impurity implant process (ion implant) for forming the junction (i.e., the drain region and the source region) is performed after the recess regions 106 are formed. The ion implant process is performed up to the bottom of the recessed active region. Thereafter, an impurity process for controlling the threshold voltage (Vt) is further carried out in order to reduce the leakage between the source region and the drain region of the select transistors SST, DST. In accordance with one embodiment of the present invention, the leakage is not generated between the source region and the drain region by lengthening the valid channel length (the longitudinal direction) of the select transistors SST, DST. Accordingly, the impurity implant process for controlling the threshold voltage (Vt) may be omitted.

Figure 3D:
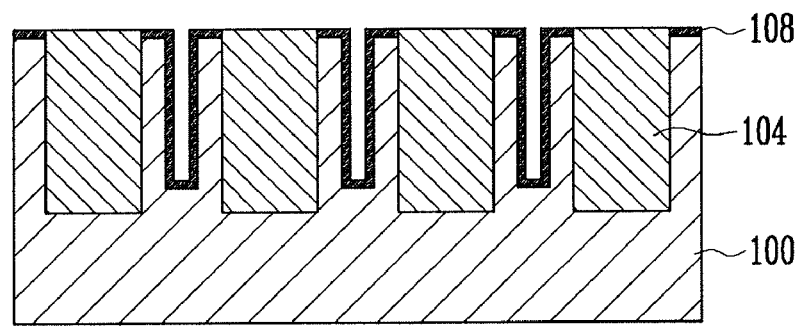

Referring to FIG. 3D, a tunnel oxide film 108 is thinly formed over regions including the inside regions of recess regions 106 but not over regions of isolation films 104. Tunnel oxide film 108 may be formed by performing an oxidation or radical oxidation process at a temperature of about 300° C. to about 1500° C. so that it has a conformal step coverage. A reaction gas such as $O_2$, $N_2O$, wet oxygen, radical or the like may be used.

Figure 3E:
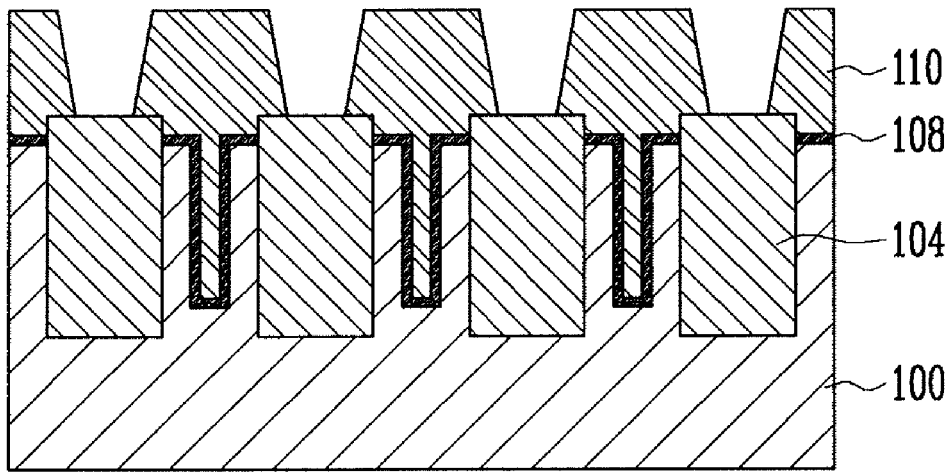

Referring to FIG. 3E, a conductive film for a floating gate is deposited to a thickness of about 200 Å to about 10000 Å on the tunnel oxide film 108 at a temperature of about 300° C. to about 900° C. A floating gate 110 is then formed using a mask (not shown). The conductive film for floating gate may be formed using a single film of doped polysilicon or undoped polysilicon or a combination thereof. FIG. 3E is a cross-sectional view of the NAND flash memory device taken along line A-A' in FIG. 4D.

Figure 3F:
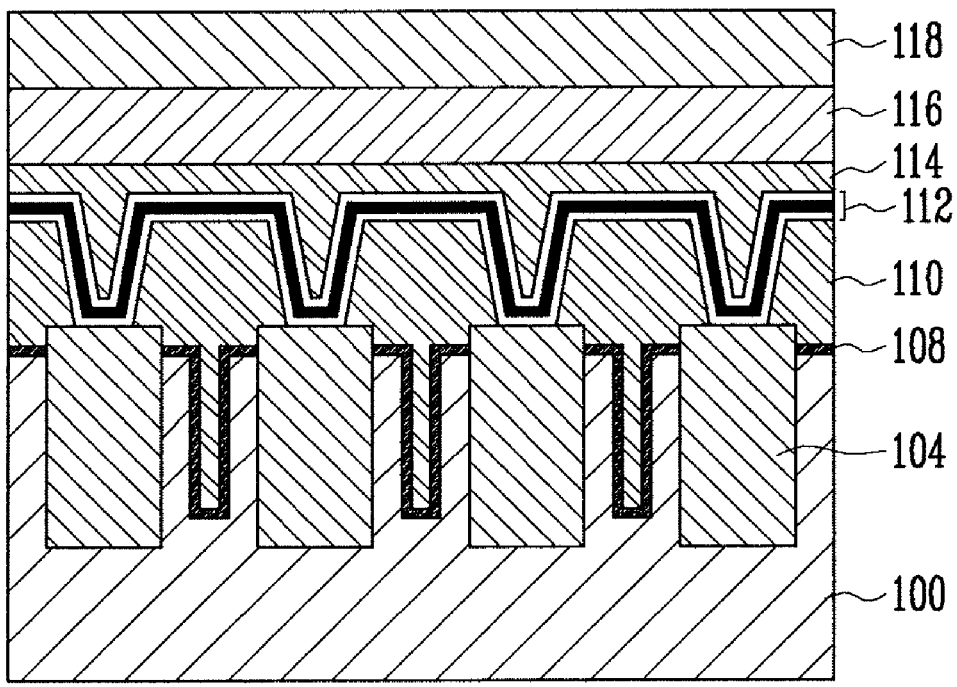

Referring to FIG. 3F, Inter Poly Oxide (IPO) is deposited along the steps of the floating gate 110 and the isolation films 104 to form a dielectric film. An ONO film ($SiO_2/Si_3N_4/SiO_2$) 112 or a high dielectric material as the dielectric film may be deposited using Chemical Vapor Deposition (CVD) or Atomic Layer Deposition (ALD). The ONO film ($SiO_2/Si_3N_4/SiO_2$) 112 may be deposited to a thickness of about 10 Å to about 1000 Å and the high dielectric material may be deposited to a thickness of about 1 Å to about 1000 Å. $Al_2O_3$, $Ta_2O_5$, $HfO_2$, $ZrO_3$, $SrTiO_3$ or the like, which have predetermined ratios, may be used as the high dielectric material.

Figure 4E:
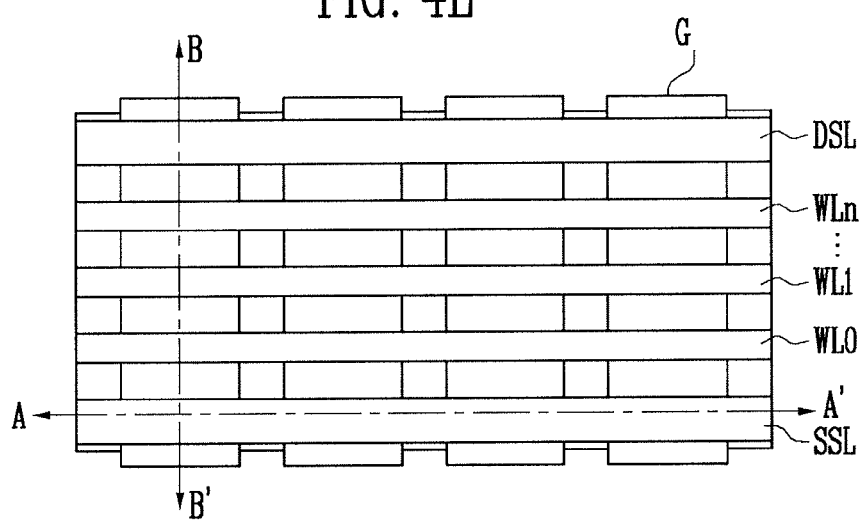

Thereafter, a conductive film for control gate 114, metal 116 and a nitride film for hard mask 118 are deposited on the dielectric film 122 in order to form the control gate. The conductive film for control gate 114 may be deposited to a thickness of about 200 Å to about 5000 Å and the nitride film for hard mask 118 may be deposited to a thickness of about 100 Å to about 10000 Å through metal capping. In some embodiments, tungsten, tungsten silicide or the like may be used as the metal 116. In addition, the conductive film for control gate may be formed using a single film of doped polysilicon or undoped polysilicon or a combination thereof. FIG. 3F is a cross-sectional view of the NAND flash memory device taken along line A-A' in FIG. 4E. In FIG. 4E, "G" designates the gate.

Figure 3G:
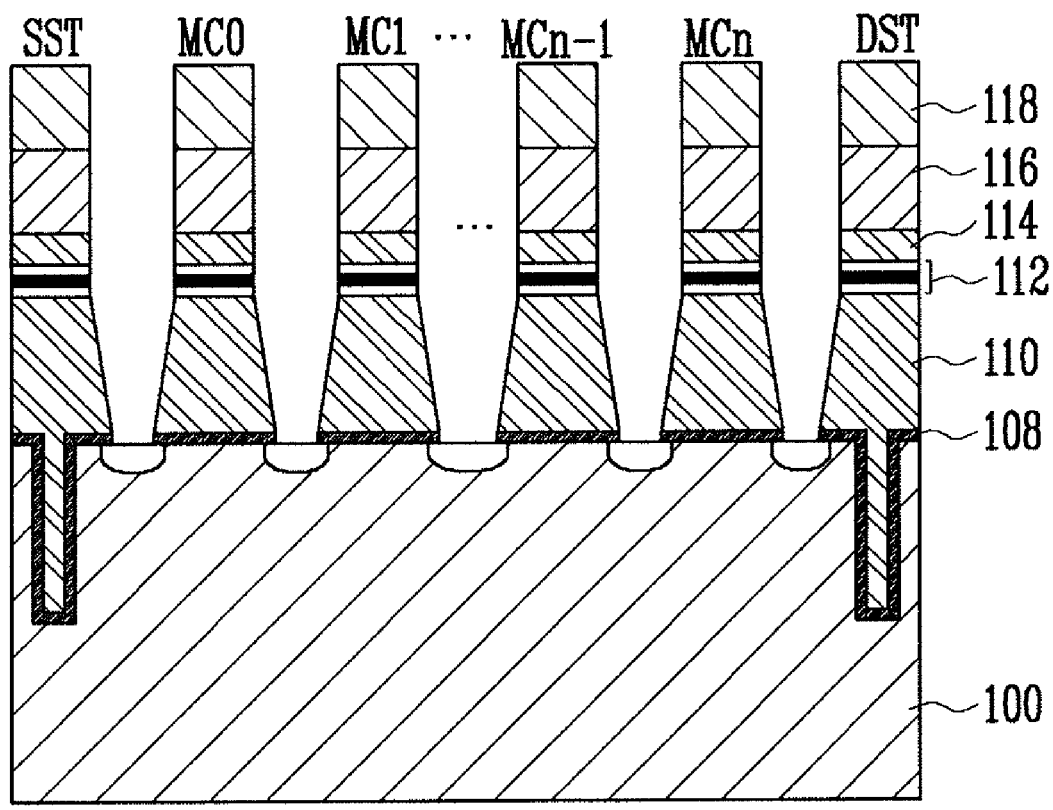

FIG. 3G is a cross-sectional view of the NAND flash memory device taken along line B-B' in FIG. 4E. In FIG. 3G, the gates of the source select transistor SST and the drain select transistor DST are recessed lower than the active region of the silicon substrate. From FIG. 3A, it can be seen that the valid channel length in a longitudinal direction of the gates of the select transistors SST, DST is longer than the channel length of the gates of the memory cells MC0 to MCn.

If the channel existing between the source region and the drain region is lengthened as in the embodiment described above, an electric field is applied to electrons, which are generated at the interface between the gate oxide films of the select transistors SST, DST. In addition, the silicon substrate is weakened (i.e., an electric field applied to electrons=voltage/distance, if the distance is increased with the voltage being constant, electric field is weakened).

In other words, a distance in which electrons generated at the interface between the gate oxide films of the select transistors SST, DST and the silicon substrate are moved up to the memory cells MC0, MCn by means of a lengthened channel length is lengthened compared with the device shown in FIG. 1. In this case, energy of the electrons of the select transistors SST, DST is weakened while moving toward the memory cells MC0, MCn (i.e., an electric field is weakened). Accordingly, the electrons are not introduced into the floating gate FG of the memory cells MC0, MCn. Consequently, in the program operation, program disturbance is not generated in the program prohibit cells MC0, MCn within non-selected strings.

FIGS. 5A to 5H are cross-sectional views of a NAND flash memory device according to another embodiment of the present invention. FIG. 6 is a layout diagram of the NAND flash memory device according to another embodiment of the present invention.

Figure 5A:
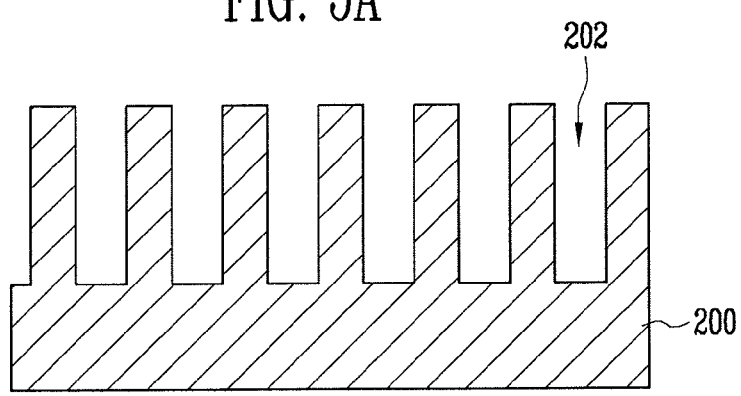
FIGS. 5A to 5H are cross-sectional views of a NAND flash memory device in accordance with another embodiment of the present invention.
Figure 6:
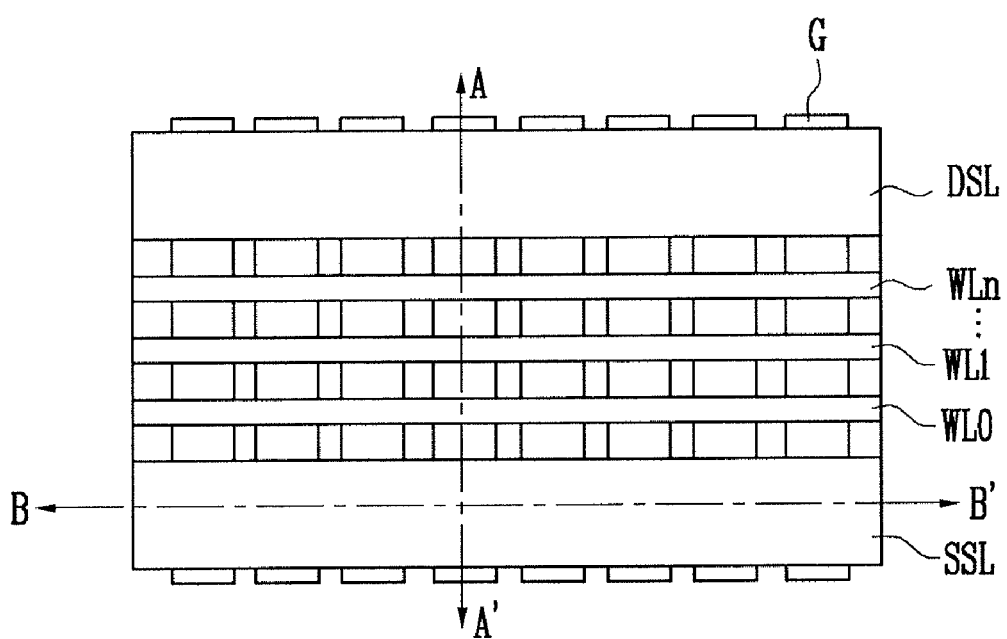
FIG. 6 is a layout diagram of the NAND flash memory device in accordance with another embodiment of the present invention.

Referring to FIG. 5A, to form gates of select transistors, which are recessed lower than the active region, a silicon substrate 200 in which the gates of the select transistors will be formed is recessed to form recess regions 202. The recess regions 202 may be formed by an etch process using an etch gas.

Figure 5B:
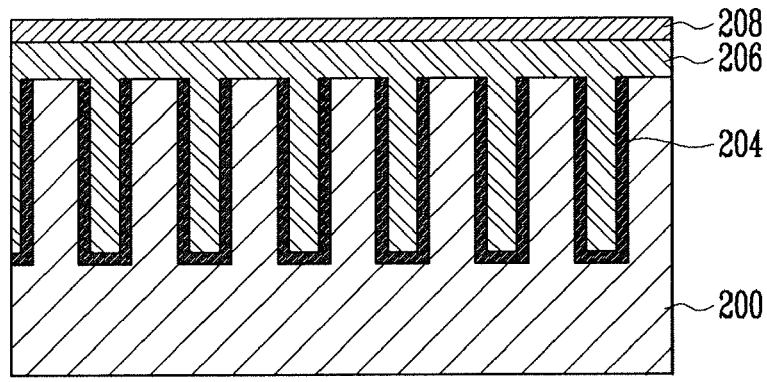

Referring to FIG. 5B, after a tunnel oxide film 204 is thinly deposited within the recess regions 202, a polysilicon film for forming a first floating gate 206 is deposited. A hard mask 208 for forming a self-aligned STI film is then deposited on the polysilicon film.

Figure 5C:
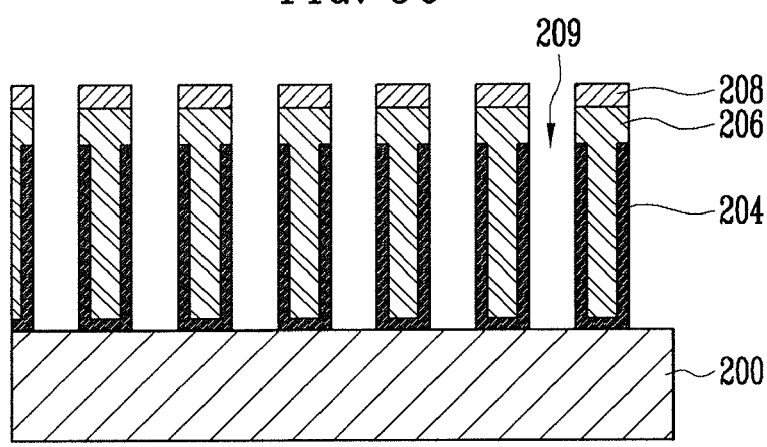

Referring to FIG. 5C, the hard mask 208 is patterned. The silicon substrate 200 is then etched using the patterned hard mask 208 as an etch mask, forming trenches 209 for forming self-aligned STI films.

Figure 5D:
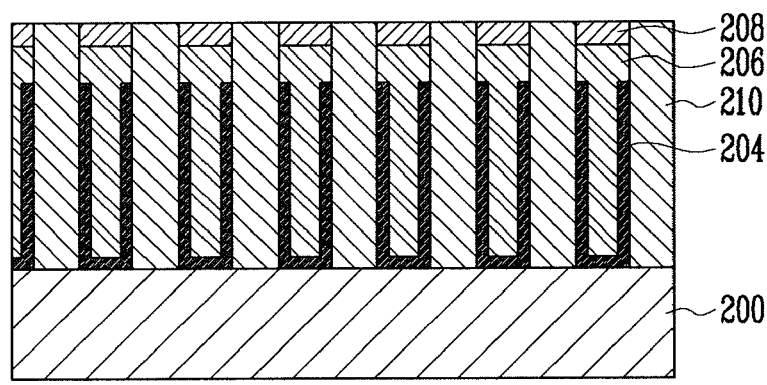

Referring to FIG. 5D, the insides of the trenches 209 are gap-filled with an oxide film to form STI films 210. The entire surface is then polished by CMP. A HDP oxide film may be used as the oxide film for gap-filling the STI films 210, but any one of the HDP oxide film, BPSG, SOG, or a combination thereof may be used as the oxide film.

Figure 5E:
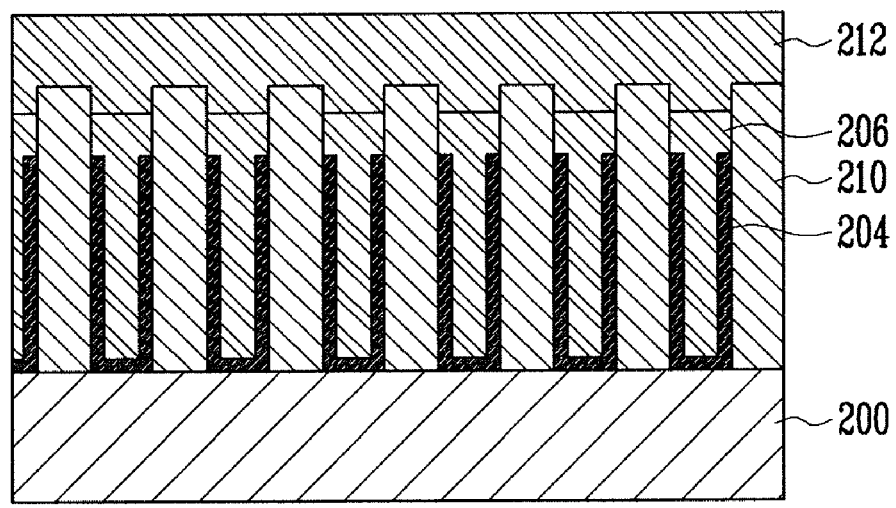

Referring to FIG. 5E, after the hard mask 208 is stripped, a second polysilicon film for forming floating gate 212 is deposited on the first polysilicon film 206.

Figure 5F:
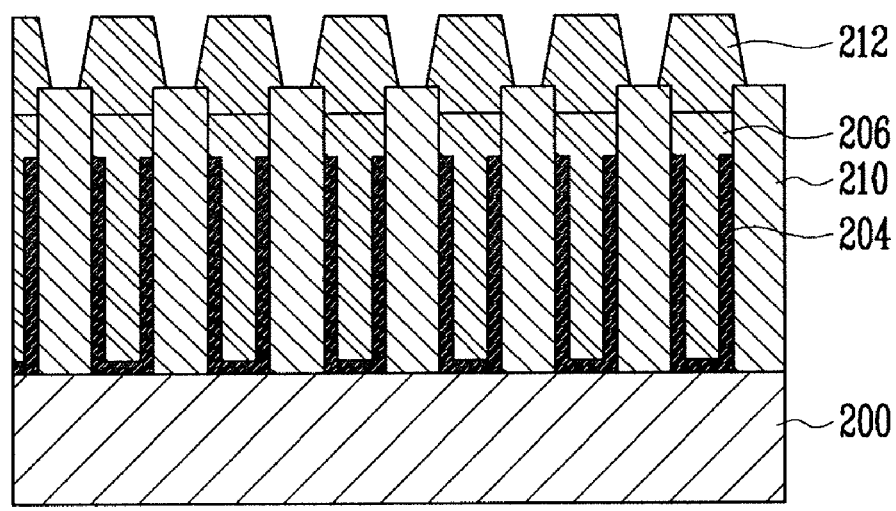

Referring to FIG. 5F, the second polysilicon film 212 is etched to form a floating gate. In one embodiment, the second polysilicon film 212 may not be deposited and the first polysilicon film 206 may be used as the floating gate.

Figure 5G:
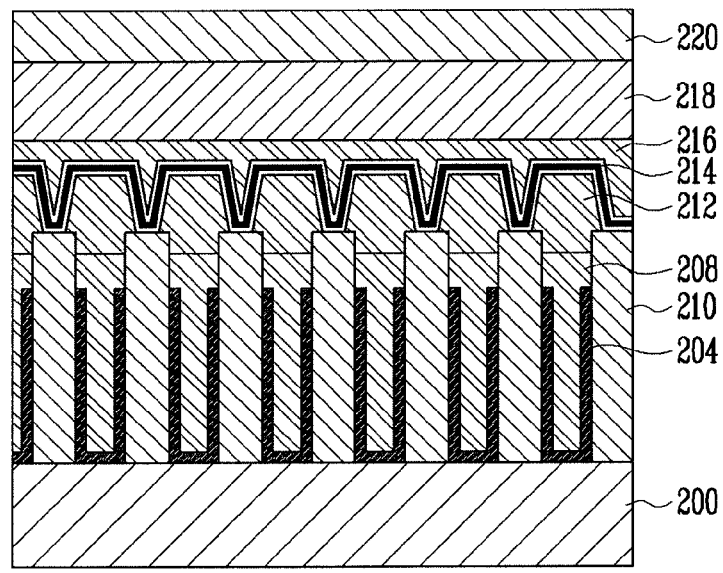

Referring to FIG. 5G, to form a control gate, a dielectric film 214, a polysilicon film 216, metal 218 and a hard mask 220 are sequentially deposited on the second polysilicon film 212. FIG. 5G is a cross-sectional view of the NAND flash memory device taken along a longitudinal direction as shown by line A-A' in FIG. 6.

Process conditions for forming the gates of the select transistors are the same as those described in the embodiment described above.

Figure 5H:
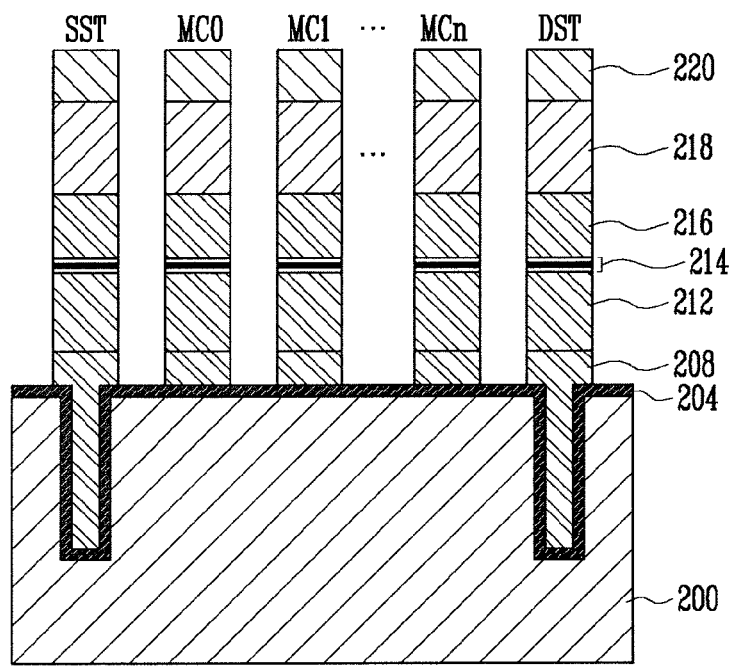

FIG. 5H is a cross-sectional view of the NAND flash memory device taken along line B-B' in FIG. 6. In FIG. 5H, the gates of the source select transistor SST and the drain select transistor DST are recessed lower than the active region of the silicon substrate. Accordingly, it can be seen that the channel length (the longitudinal direction) of the gates of the select transistors SST, DST is longer than that of the gates of the memory cells MC0 to MCn.

If the channel existing between the source region and the drain region is lengthened, program disturbance is not generated in the program prohibit cells MC0 to MCn within non-selected strings in the program operation of the NAND flash memory device by way of the same principle as described in the embodiment described above.

In FIG. 3G and FIG. 5H, it has been shown that the channel length of the source select transistor gate and the drain select transistor gate is longer than that of the memory cell gate. However, the channel length of the source select transistor gate may be longer than that of the memory cell gate, and the channel length of the drain select transistor gate may be longer than that of the memory cell gate.

In addition, in the embodiments described, the channel length of each of the source select transistor gate and the drain select transistor gate is longer than that of the memory cell gate. However, the channel length of the memory cell gate may also be the same as that of each of the source select transistor gate and the drain select transistor gate.

It has also been described above that the gate size (the gate width) of the select transistors SST, DST is formed larger than that of the memory cells to reduce problems such as program disturbance. In certain embodiments of the present invention, however, the program disturbance phenomenon is not generated since the channel length of each of the gates of the select transistors SST, DST is lengthened. Accordingly, the gate size of the select transistors SST, DST is formed to be the same as that of the memory cells. However, the gate size (the gate width) of the select transistors SST, DST may be formed greater than that of the memory cells.

Furthermore, in certain embodiments of the present invention, a distance between the source select transistor SST and the first memory cell MC0, which is the closest to the source select transistor SST, and a distance between the drain select transistor DST and the last memory cell MCn, which is the closest to the drain select transistor DST, are set to be the same as that between the source select transistor SST and the remaining memory cells and between the drain select transistor DST and the remaining memory cells. However, the distance between the source select transistor SST and the first memory cell MC0, which is the closest to the source select transistor SST, and the distance between the drain select transistor DST and the last memory cell MCn, which is the closest to the drain select transistor DST, may be set wider than that between the source select transistor SST and the remaining memory cells and between the drain select transistor DST and the remaining memory cells.

The present invention can provide significant advantages when the number of memory cells within a cell string is increased and in the case of MLCs requiring narrow threshold voltage distributions.

As described above, in accordance with embodiments of the present invention, in the program operation of a NAND flash memory device, program disturbance can be prevented from occurring in memory cells adjacent to source and drain select transistors within non-selected strings.

Furthermore, according to the present invention, the size (a gate width) of source and drain select transistor gates can be significantly reduced. In other words, an overall chip size can be shrunken by making the size of the source and drain select transistor gates and the memory cell gate the same.

In addition, according to the present invention, a distance between the source and drain select transistors and memory cell gates adjacent to the source and drain select transistors are set to be the same as that between the remaining memory cell gates. It is thus possible to shrink an overall chip size.

Furthermore, according to the present invention, an impurity implant process for controlling the threshold voltage of the source and drain select transistors can be omitted. This can contribute to a reduction in the process steps.

Consequently, the present invention is advantageous in that it can reduce the cost and improve the yield.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a NAND flash memory device having a plurality of memory cells connected in series between a drain select transistor and a source select transistor, the method comprising:
    recessing a gate formation region of a semiconductor substrate to form at least one recess for a recessed gate of at least one of the source select transistor or the drain select transistor;
    depositing a tunnel oxide film in the at least one recess and over the semiconductor substrate at locations of gates of the plurality of memory cells, wherein the tunnel oxide film formed in the at least one recess extends below the tunnel oxide film formed at the locations of gates of the plurality of memory cells;
    depositing a polysilicon film for a floating gate over the tunnel oxide film and within the at least one recess for at least one of the drain select transistor or the source select transistor;
    depositing a hard mask on the polysilicon film;
    patterning the hard mask and then etching the polysilicon film for the floating gate and the tunnel oxide film using the patterned hard mask as an etch mask, forming trenches for forming isolation films;
    gap-filling the insides of the trenches with an oxide film and then polishing the entire surface to form the isolation films; and
    forming a dielectric film and a conductive film for a control gate on the polished surface.

2. The method as claimed in claim 1, wherein a width in the traverse direction of the at least one recess is narrower than or the same as that of the gates of the plurality of memory cells.

3. The method as claimed in claim 1, wherein a depth of the at least one recess is shallower than or the same as that of the isolation films.

4. The method as claimed in claim 1, wherein the gate formation region is recessed using plasma gas.

5. The method as claimed in claim 4, wherein energy of the plasma gas is about 100 Watt to about 3 kWatt.

6. The method as claimed in claim 1, wherein the gate formation region is recessed using gas including HBr, Ar, or He added to a $Cl_2$ base.

* * * * *